United States Patent [19]
Mahan et al.

[11] Patent Number: 5,397,737
[45] Date of Patent: Mar. 14, 1995

[54] DEPOSITION OF DEVICE QUALITY LOW H CONTENT, AMORPHOUS SILICON FILMS

[75] Inventors: Archie H. Mahan, Golden; Jeffrey C. Carapella, Evergreen; Alan C. Gallagher, Louisville, all of Colo.

[73] Assignee: The United States of America as represented by the United States Department of Energy, Washington, D.C.

[21] Appl. No.: 253,840

[22] Filed: Jun. 3, 1994

Related U.S. Application Data

[63] Continuation of Ser. No. 878,585, May 5, 1992, abandoned.

[51] Int. Cl.6 .......................................... H01L 21/203
[52] U.S. Cl. ...................................... 437/101; 427/99
[58] Field of Search ........................ 427/99; 437/101; 148/DIG. 1

[56] References Cited

U.S. PATENT DOCUMENTS

| | | |
|---|---|---|
| 4,237,150 | 12/1980 | Wiesmann . |
| 4,237,151 | 12/1989 | Strongin et al. . |
| 4,459,163 | 7/1984 | MacDiarmid et al. ............... 437/101 |
| 4,485,128 | 11/1984 | Dalal et al. ............................ 437/101 |
| 4,634,605 | 1/1987 | Wiesmann . |
| 4,702,965 | 10/1987 | Fang . |
| 4,749,588 | 6/1988 | Fukuda et al. . |
| 4,810,526 | 3/1989 | Ito et al. . |
| 4,839,701 | 6/1989 | Imagawa et al. . |
| 5,151,383 | 9/1992 | Meyerson et al. .................. 437/101 |

FOREIGN PATENT DOCUMENTS 3187215 8/1991 Japan .

OTHER PUBLICATIONS

Scott, B. et al., "Deposition of a–Si:H by Homogeneous CVD", Journal de Physique, Coll C4, Supp. No. 10, Tome 42, Oct. 1981.
"Production of high-quality amorphous silicon films by evaporative silane surface decomposition", J. Doyle, R. Robertson, G. H. Lin, M. Z. He, and A. Gallagher, J. Appl. Phys., 65(6), 15 Sep. 1988.

Primary Examiner—George Fourson
Attorney, Agent, or Firm—Edna O'Connor; Thomas G. Anderson; William R. Moser

[57] ABSTRACT

A high quality, low hydrogen content, hydrogenated amorphous silicon (a-Si:H) film is deposited by passing a stream of silane gas ($SiH_4$) over a high temperature, 2000° C., tungsten (W) filament in the proximity of a high temperature, 400° C., substrate within a low pressure, 8 mTorr, deposition chamber. The silane gas is decomposed into atomic hydrogen and silicon, which in turn collides preferably not more than 20–30 times before being deposited on the hot substrate. The hydrogenated amorphous silicon films thus produced have only about one atomic percent hydrogen, yet have device quality electrical, chemical, and structural properties, despite this lowered hydrogen content.

4 Claims, 7 Drawing Sheets

DEPOSITION OF DEVICE QUALITY LOW H CONTENT, AMORPHOUS SILICON FILMS

CONTRACTUAL ORIGIN OF THE INVENTION

The United States Government has rights in this invention under Contract No. DE-AC02-83CH10093 between the U.S. Department of Energy and the Solar Energy Research Institute, a Division of Midwest Research Institute.

This application is a continuation of application Ser. No. 07/878,585, filed May 5, 1992, now abandoned.

BACKGROUND OF THE INVENTION

1. Field of the Invention

The present invention relates to the deposition of thin films of material on a substrate, and more specifically to the deposition of device quality hydrogenated amorphous silicon (a-Si:H) containing low hydrogen content for use as photovoltaic and other semiconducting devices.

2. Description of the Prior Art

In the manufacture and construction of microelectronic semiconductor devices and photovoltaic solar cells, amorphous silicon is often a feasible alternative to the use of silicon crystals for layers of a device, due to economics, flexibility in manufacture, and higher through-put. However, amorphous silicon tends to react chemically with its environment, causing it to become contaminated, and thereby deteriorating the chemical, electrical, and mechanical properties of the intrinsic or undoped silicon. This reactivity of the amorphous silicon can be passivated by the incorporation of hydrogen into the amorphous silicon layer, which is usually accomplished during the deposition process, and it considerably improves the electrical properties of the individual layers and the device.

Two measures of these electrical properties of hydrogenated amorphous silicon layers are the Urbach tail width and the density of midgap states, both of which should be minimized to achieve device quality semiconductor films. Although exact mechanisms are not known, there has appeared to be a relationship between the amount of hydrogen incorporated and both the Urbach tail width and density of midgap states. At hydrogen concentrations too low, the amorphous silicon film exhibits very poor electrical properties due to the high density of midgap states and is thus not suitable for use in practical devices. At hydrogen concentrations too high, these films show an increased density of microvoids and once again inferior electrical properties.

Incorporation of this hydrogen into the amorphous silicon film is not without its costs, however. Specifically, when this hydrogenated amorphous silicon is used in photovoltaic solar cells, these solar cells over time degrade electrically upon exposure to sunlight. This degradation, which is referred to as the Staebler-Wronksi effect, has been strongly linked to the concentration of hydrogen within the amorphous silicon film. The prevalent model for the Staebler-Wronksi effect suggests that the degradation is due to movement of hydrogen within the film.

In the last decade or so, since the development of the glow discharge (GD) technique as the standard means for producing device quality hydrogenated amorphous silicon films for solar cells and other applications, there has been considerable progress made in increasing the efficiencies of these solar cells. However, most of this progress has been in improved techniques in manufacturing and utilization of these solar cells, such as better uniformity of deposition, better light utilization, and better doping of layers. There has been little or no significant improvement in the quality of the intrinsic or undoped material. There is a general belief in the industry that the present intrinsic material quality of the hydrogenated amorphous silicon film has already been optimized. Yet, as indicated above, there is still room, in fact a need, for additional attention and improvement to this technology to increase efficiencies and usefulness, particularly for solar applications.

SUMMARY OF THE INVENTION

Accordingly, a general object of the present invention is to provide a hydrogenated amorphous silicon film which demonstrates significantly improved material quality of the intrinsic or undoped material.

Another general object of the present invention is to provide a viable, economical, and high through-put method of depositing hydrogenated amorphous silicon films for solar cells and other applications which demonstrate significantly improved electrical, chemical, and structural qualities.

A more specific object of this invention is to provide a hydrogenated amorphous silicon film which exhibits increased integrity and improved electrical properties despite containing a lower hydrogen concentration.

Another more specific object of this invention is to provide a device quality hydrogenated amorphous silicon film which contains hydrogen contents significantly lower than the hydrogen contents of device quality material produced to date, and which thereby reduces the degradation associated with the movement of hydrogen in the film upon exposure to sunlight.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method of this invention may comprise producing a thin film of hydrogenated amorphous silicon with a low hydrogen content by flowing a silicohydride gas past a filament which has been heated to a sufficient temperature to thermally decompose the silicohydride on the filament into mostly atomic silicon and atomic hydrogen. The filament should be heated to at least 1500° C. but is preferably heated to about 2000° C. This gaseous mixture of mostly atomic silicon and atomic hydrogen is then evaporated from the filament and is deposited onto a substrate heated to between 330° C. and 600° C., but which is preferably heated to about 400° C. This procedure of thermally decomposing the silicohydride on the heated filament and then depositing the resultant gaseous mixture onto a heated substrate occurs within a vacuum deposition chamber, evacuated to an optimal pressure in the range of about 5–50 milliTorr, preferably about 8 milliTorr.

The silicohydride gas may be silane, disilane, or other gases or combinations of gases containing silicon and hydrogen. The heated filament is preferably made from tungsten, but can be made from other high temperature materials such as graphite or silicon carbide. When the silicohydride gas is decomposed at those temperature and pressure ranges described above, the hydrogen content of the film appears to be controlled by the temperature of the substrate, such that the higher the temperature the lower the hydrogen content. Despite hydrogen contents as low as one atomic percent hydrogen, the hydrogenated amorphous silicon films still exhibit photovoltaic device quality electrical, chemical, and mechanical properties which will not as readily degrade upon exposure to sunlight.

BRIEF DESCRIPTION OF THE DRAWINGS

The accompanying drawings, which are incorporated herein and form a part of the specification illustrate preferred embodiments of the present invention, and together with the description, serve to explain the principles of the invention. In the drawings.

DETAILED DESCRIPTION OF THE PREFERRED EMBODIMENTS

A device quality low hydrogen content, hydrogenated amorphous silicon film is produced by the high temperature decomposition of a gas containing silicon and hydrogen, under a vacuum, by depositing the decomposed gas onto a heated substrate. Heretofore it has been believed that to achieve a device quality hydrogenated amorphous silicon film, as determined by measuring such parameters as Urbach Tail widths, Tauc's Bandgap, Photoconductivity, and Dark Conductivity, that the film had to contain at least between 10 and 15 atomic percent (at. %) hydrogen. However, the low hydrogen content, hydrogenated amorphous silicon films produced according to the principles of the present invention, at about 1 at. % hydrogen, exhibits superior device quality films despite their low hydrogen content.

Figure 1:
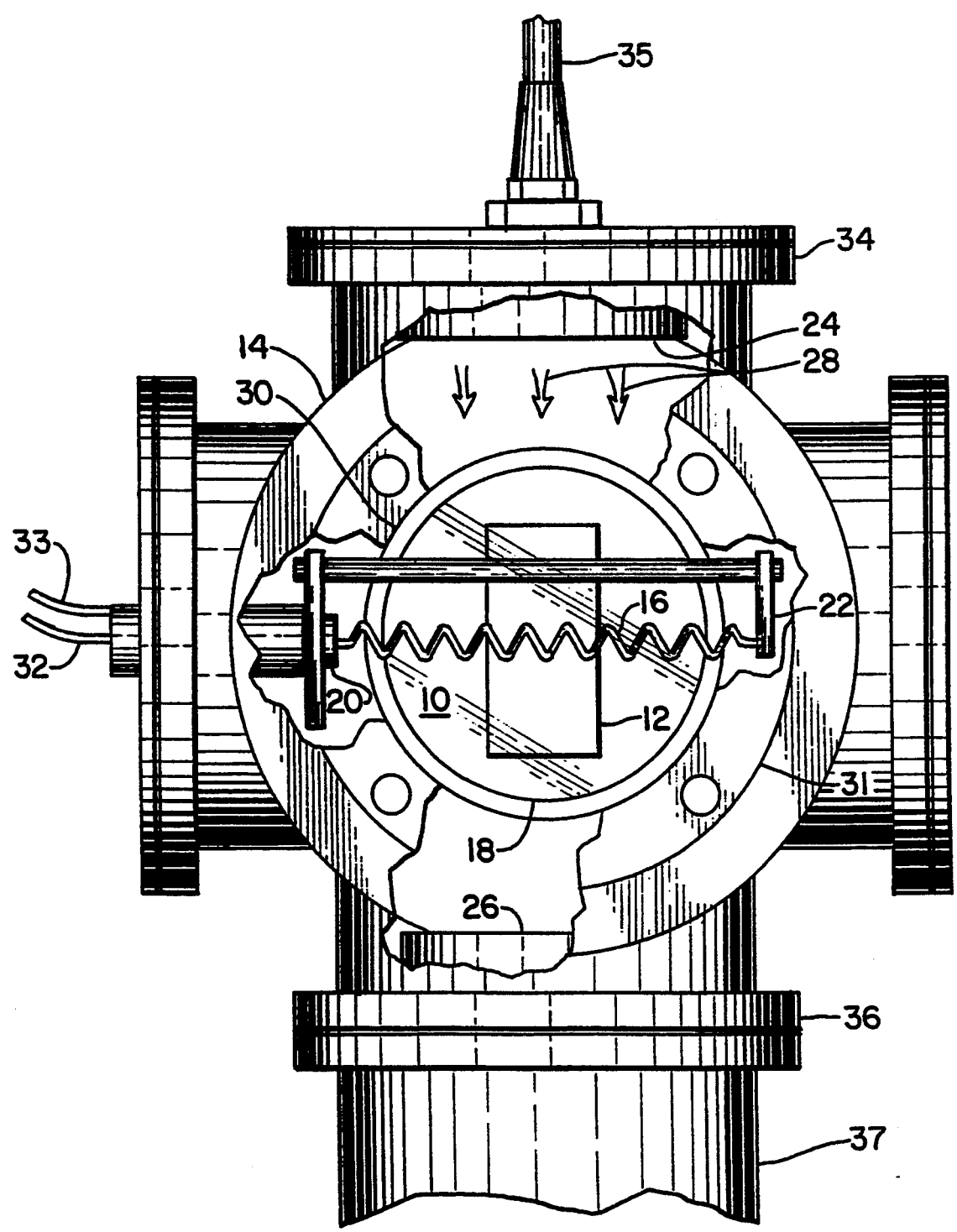
FIG. 1 is a top plan view of a hot filament chemical vapor deposition chamber suitable for producing the low hydrogen content, hydrogenated amorphous silicon film according to the principles of the present invention.

The low hydrogen content, hydrogenated amorphous silicon film may be produced according to this invention with any suitable apparatus, as will be understood readily by persons skilled in the art upon gaining an understanding of the features of this invention. However, to facilitate the explanation of this invention, suitable apparatus is illustrated in FIG. 1. A typical vacuum deposition chamber 10 enclosed by a housing 14 is illustrated from a top plan view with a transparent window 30 mounted in the top flanged opening 31 and with portions of the housing 14 broken away to show the operative components in the chamber 10. A substrate table or holder 18 is positioned in the chamber 10 to support a substrate 12 on which the hydrogenated amorphous silicon film is to be deposited. A heating element (not shown) is provided under the substrate table 18, preferably outside the vacuum system, to heat the substrate 12 to the desired temperatures, which are described in more detail below. A wire filament 16, preferably tungsten, is supported between two electrodes 20, 22 a spaced distance over the substrate holder 18, and electric power is supplied to the electrodes 20, 22 by wire leads 32, 33. A gas inlet 24 mounted in flange 34 is connected by a conduit 35 to a feed gas source (not shown), and an outlet port 26 mounted in the diametrically opposite flange 36 is connected by a conduit 37 to a vacuum pump (not shown).

In operation, the substrate 12 is placed on support table 18, and the chamber 10 is sealed. The vacuum pump (not shown) is turned on, and the chamber 10 is evacuated. A silicohydride gas, as will be described in more detail below, is made to flow into the chamber 10 through tube 35 and inlet 24, as indicated by arrows 28. The silicohydride gas flows across chamber 10 preferably transverse to the filament 16. When electric power is applied to the filament 16, it gets very hot, and the silicohydride gas is absorbed onto the hot filament 16 similar to a catalytic converter, where it is decomposed and re-evaporated substantially in the form of its simple atomic species, silicon and hydrogen. The silicon and hydrogen are then coated onto the substrate, as will be described in more detail below.

There are four important identified deposition parameters that have to be optimized to produce good device quality films of hydrogenated amorphous silicon, according to this invention, with substantially lower hydrogen contents than were heretofore possible with previous deposition techniques. These four parameters, all of which have to be coordinated and kept within the preferred ranges, include filament temperature, chamber pressure, distance between filament and substrate, and substrate temperature, as will be described in more detail below.

The filament temperature at which the decomposition of the silicohydride gas begins will vary somewhat, depending on the specific silicohydride gas used, such as, for example, silane, disilane, or other gases or combinations of gases containing silicon and hydrogen. The preferred gas is silane ($SiH_4$), for which the filament 16 temperature should be at least 1,500° C. and preferably 2000° C. That temperature provides the most efficient and effective decomposition of the silane gas to its constituent elements, silicon and hydrogen. The flow of silane, preferably at a rate of about 20 sccm can be regulated by a flow controller and is pumped through the chamber by means of a turbo-molecular pump. The temperatures at the ends of the filament 16 are usually not as high as in the center, and, where such end temperatures are less than 1500° C., such as around 1400° C., the silicon, and possibly even the hydrogen, tend to alloy at those outer ends, which is an undesirable effect that should be kept to a minimum for the purposes of this invention.

As the decomposed silicon and hydrogen atomic species are evaporated off the hot filament 16 and migrate toward the substrate 12, some collisions occur among the silicon and hydrogen atoms and the undecomposed $SiH_4$ gas molecules due to normal Brownian movements. A few of these collisions seem to be desirable, even necessary, according to this invention, to produce a good, device quality, hydrogenated amorphous silicon. However, too few collisions and too many collisions are deleterious to the quality of the film. The number of atomic collisions is a function of the pressure in chamber 10 and of the distance between the filament 16 and the substrate 12, so those parameters have to be controlled carefully. It has been found, according to this invention, that a pressure in the range of about 5 to 50 milliTorr, (preferably about 8 milliTorr) and a distance between the filament 16 and substrate 12 in the range of about 2 to 30 cm, (preferably about 5 or 6 cm) produces the best results. The preferred pressure and spacing produce about 20 to 40 atomic collisions as the atoms migrate from the filament 16 to the substrate 12, based on the statistical relationship of mean free path of an atomic particle being about eight divided by the pressure in milliTorr, which, as mentioned above, appears to produce the best results for device quality film.

Figure 2:
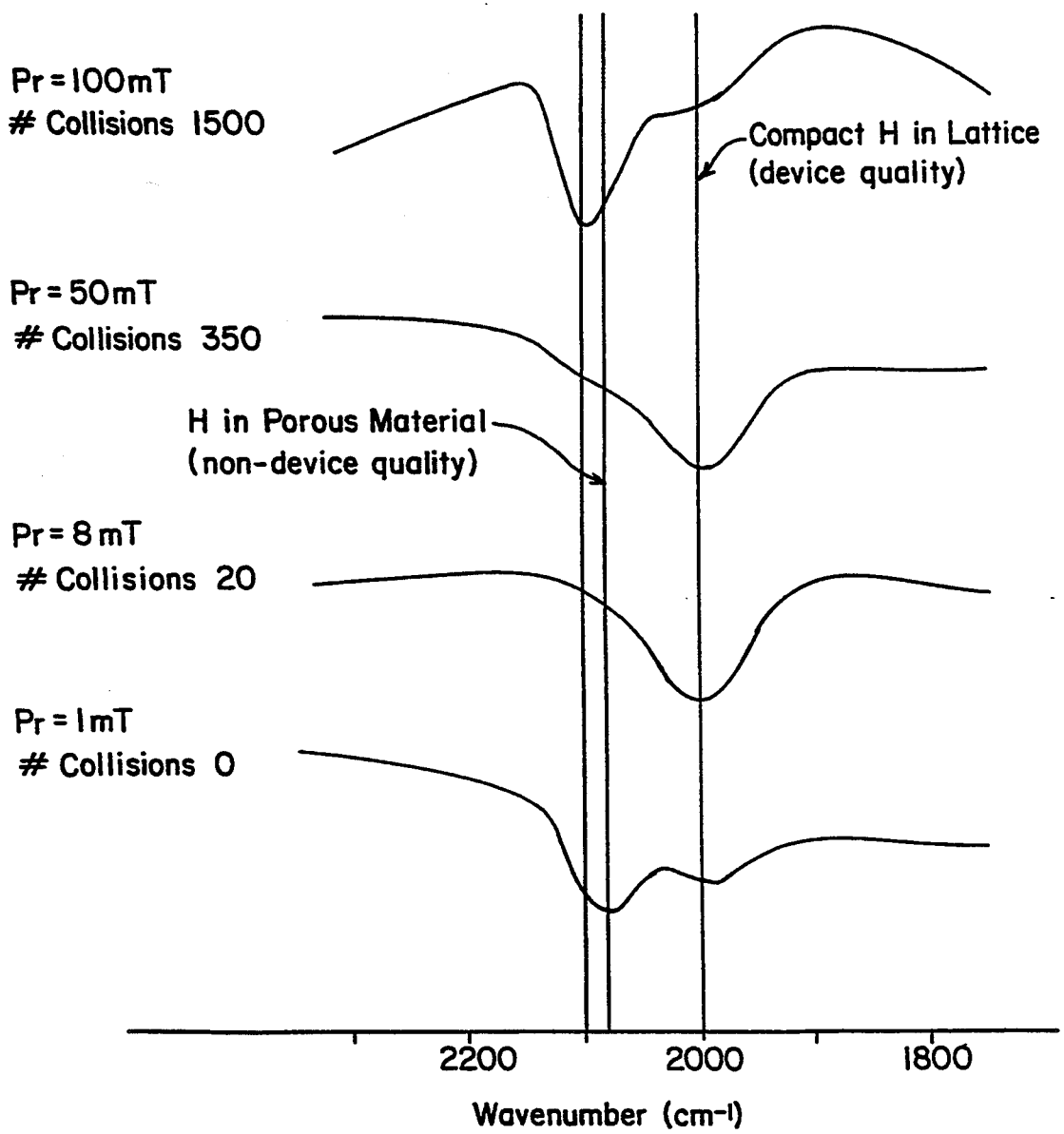
FIG. 2 is a graph that shows the type of Si—H bonding versus the approximate number of collisions the atomic species evaporated from the 2000° C. filament undergo as they traverse the filament to substrate distance in the deposition chamber and illustrates the parameters that produce device quality a-Si:H according to this invention.

The graphs in FIG. 2 show the types of Si—H bonding versus the approximate number of collisions that the atomic species evaporated from the 2000° C. filament undergo as they traverse the filament-substrate distance in the deposition chamber. The graphs are offset vertically to show differences in curve shapes. It is known in the hydrogenated amorphous silicon field that a dip in the transmission curve in the neighborhood of 2000 wave numbers is the signature of H bonded in the monohydride, or SiH mode. This characteristic is indicative of H bonded in a compact Si lattice, and it is observed traditionally in device quality a-Si:H. It is also known that a dip in the transmission curve in the neighborhood of 2070–2100 wave numbers can be the signature of H bonded polyhydride, or $(SiH_2)_n$ mode, which is indicative of H bonded in a porous lattice and is observed traditionally in non-device quality a-Si:H. As can be seen in FIG. 2, when the number of collisions are either too few or too many, the polyhydride signature is clearly evident. It is only when the number of collisions is limited, as discussed in this invention, that device quality a-Si:H is produced.

While it is not entirely clear at this point exactly why these pressure and distance parameters produce the best device quality hydrogenated amorphous silicon films, it is believed that the pure atomic species which are evaporated off the filament collide either with themselves or with the dissociated or undissociated silicohydride gas and produce a different mixture of radical species than is produced in the $SiH_3$ dominated glow discharge process. It is these radical species, which in turn hit the substrate, that become integrated into the growing film. Fewer atomic collisions, it is believed, would increase the likelihood of pure atomic silicon hitting the substrate, and more atomic collisions would produce higher order silicon-hydride clusters (microparticulates) to form in the gas phase and also hit the substrate. Both of these extremes would produce a-Si:H of inferior electronic and structural quality.

Experiments have shown that about 8 milliTorr pressure seems to produce the best device quality hydrogenated amorphous silicon films, and such films produced at 1 milliTorr and those produced at 100 milliTorr and higher were not as good.

The fourth parameter, the substrate temperature, also seems to be a controlling factor in the quantity of hydrogen finally incorporated into the hydrogenated amorphous silicon film. The relationship between substrate temperature and hydrogen content appears to be that the higher the substrate temperature, the lower the hydrogen content of the hydrogenated amorphous silicon film. In fact, experiments that lead to the development of this invention indicate that the hydrogen content, measured in atomic percent hydrogen, in the hydrogenated amorphous silicon film decreases monotonically as the temperature of the substrate 12 increases. Consequently, it has been found that, as used in this invention with the other parameters described above, the temperature of the substrate 12 should be maintained in the range of 330° to 600° C., and preferably at about 400° C., during the deposition process. At this preferred substrate temperature range, a significant proportion of the hydrogen atoms that hit the substrate 12 retain sufficient thermal mobility to diffuse back out of the forming hydrogenated amorphous silicon film and are released as molecular hydrogen from the growing film.

One additional factor has been identified, which might contribute to allowing a superior a-Si:H film to be produced with such low H content according to this invention. As opposed to the glow discharge process, where particles in the discharge are energetic electrons, neutral radical species and ions, the maximum energies obtainable in the process of the present invention are the thermal energies that the atomic species receive as they are evaporated off the substrate. In addition, since these species undergo a few collisions in the gas phase, the energies of the mix of radical species in the deposition chamber is reduced even further. Therefore, at these low thermal energies, no ions or energetic electrons are produced in the gas phase. Since it is generally believed that film bombardment by energetic species damages the growing film surface, films grown by the present technique may avoid the effects of such bombardment.

It has generally been believed, prior to this invention, that the "normal" hydrogen content in amorphous silicon films not only passivate the film by filling bonds, but also was necessary to reduce lattice strain in the amorphous silicon. The method of this invention, however, may allow the deposition of lower hydrogen contact hydrogenated amorphous silicon with reduced randomness of the deposited silicon, thus with reduced lattice strain between the silicon atoms within the film. This reduced silicon lattice strain, coupled with the higher substrate temperature, may also allow much of the hydrogen which strikes substrate 12 to have sufficient thermal mobility to escape being incorporated into the hydrogenated amorphous silicon film.

A lowered hydrogen content in the hydrogenated amorphous silicon film is desired because of the observed link between hydrogen content and the subsequent degradation of photovoltaic cells upon exposure to sunlight. This degrading effect is called the Staebler-Wronksi effect and is strongly linked to the hydrogen content of the amorphous silicon film. It is believed that the degradation occurs as a result of movement of the hydrogen. Accordingly, if the hydrogen content can be lowered while still retaining good device quality amorphous silicon film, as is accomplished with the present invention, the tendency or extent of the degradation of electrical properties due to the Staebler-Wronski effect can also be reduced. As mentioned above, hydrogenated amorphous silicon films produced according to this invention can have as little as one atomic percent (1 at. %) hydrogen, yet have better electrical properties, including better transport of charge carriers with band gaps comparable to prior art films that need as much as 10 to 15 at. % hydrogen to have acceptable electrical properties for device quality film.

EXAMPLE

Presented below is a comparison between a deposition of a low hydrogen content, amorphous silicon film produced according to the principles of the present invention and one produced by the more traditional glow discharge (GD) deposition process. The use of hot wire or filament to assist a vapor deposition, as in the current invention, is commonly referred to as a hot-wire-assisted chemical vapor deposition or hot wire (HW) deposition. It is to be understood that the examples given below are for illustrative purposes only, and are not intended to limit the scope of the invention as herein described or as set forth in the appended claims.

Some hot wire (HW) films were deposited using the method of the present invention, as described above, using silane gas, a deposition chamber pressure of 8 mTorr, and a filament temperature of about 2000° C. The substrate temperature, however, was varied to change the atomic percent of hydrogen contained within the various films. Each sample at a particular substrate temperature, and therefore particular atomic percent hydrogen content, was simultaneously deposited onto 7059 glass and crystalline silicon substrate. The deposition rates for these HW films, deposited according to the principles of the present invention, were 5–10 Å/sec.

The glow discharge (GD) films were deposited on the anode of a capacitively coupled, parallel plate, radio frequency deposition apparatus, which was operating at 13.56 MHz. The other operating conditions were selected to produce a high quality, or device quality, hydrogenated amorphous silicon film. These conditions include a 70 mW/cm$^2$ discharge power, silane at a flow rate of 100 sccm, and a 500 mTorr chamber pressure. Similar to the HW films, several GD films were deposited over a range of substrate temperatures, and thus, hydrogen contents, simultaneously onto 7059 glass and crystalline silicon. The deposition rates for the GD films deposited were in the range of 1.5–2.5 Å/sec.

The hydrogen content of each of these samples were determined from the films deposited onto the crystalline silicon substrate by the magnitude of the absorption of the SiH 630 cm$^1$ infrared mode. Film thickness for all samples were typically 1.5–2.5 μm, and Raman measurements showed all films to be amorphous.

Several measurements were taken on these HW and GD films in order to compare their electrical, chemical, and mechanical properties. These measurements included Urbach tail widths ($E_0$), Tauc's bandgaps ($E_g$), photoconductivity, dark conductivity, Electron Spin Resonance (ESR), and ambipolar diffusion lengths.

Figure 3:
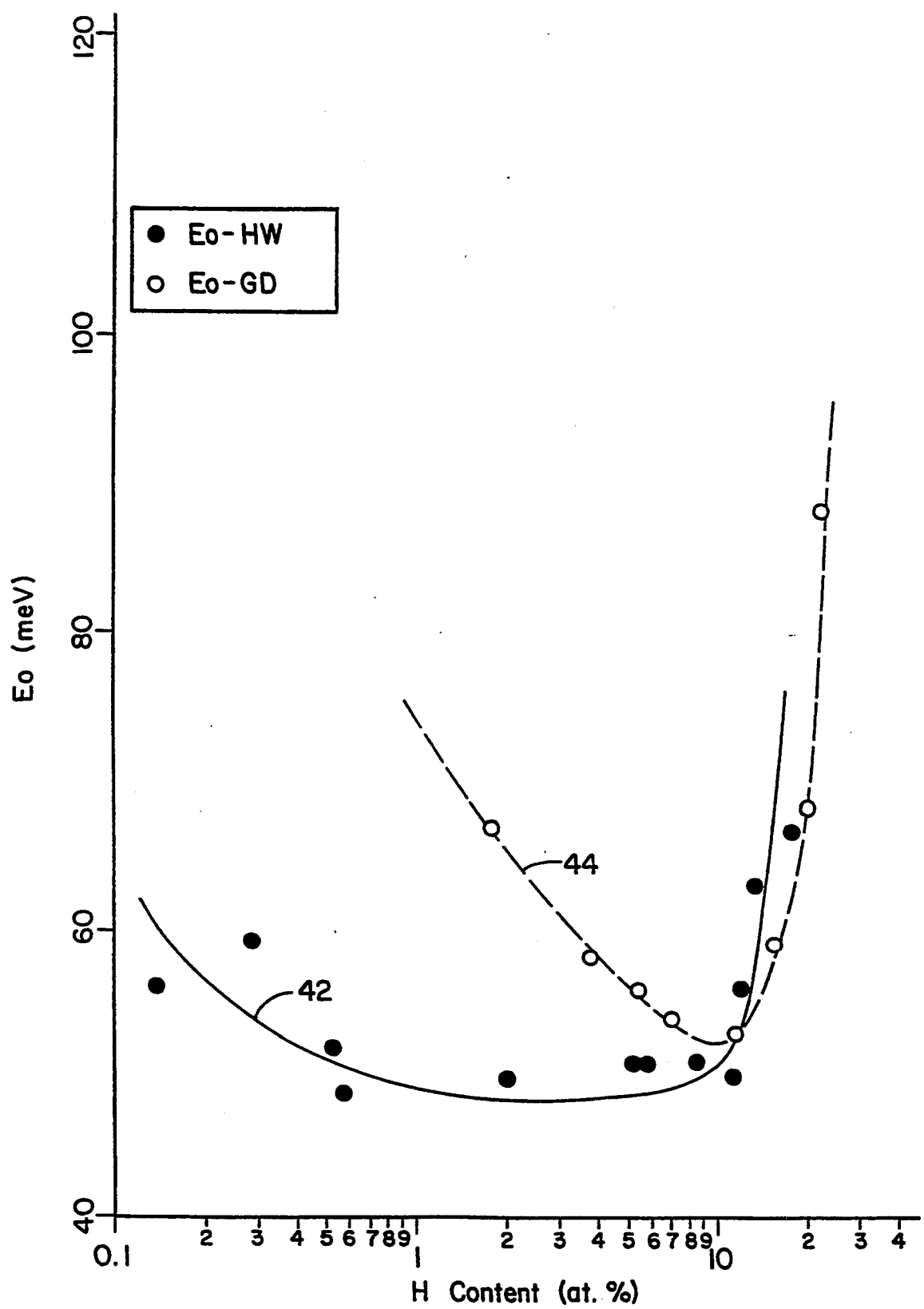
FIG. 3 is a graph of Urbach Tail widths versus hydrogen content of a series of hydrogenated amorphous silicon films produced according to the principles of the present invention and a series of traditional glow discharge deposited hydrogenated amorphous silicon films for comparison.

The Urbach tail widths ($E_0$), for the various hydrogen concentrations of the GD films and the HW films deposited according to the principles of the present invention, were determined by photothermal deflection spectroscopy. These measurements of Urbach tail widths in millielectron volts (meV) are plotted in FIG. 3 against a logarithmic scale of hydrogen concentrations or "H content" in atomic percent, to show a wide range of data and to better emphasize the differences between the GD and HW samples at low H content. The discrete data for the HW samples deposited according to the principles of the present invention are represented by the solid dots. The trends of this data are approximated by continuous line 42. Similarly, the discrete data for the GD samples are represented by the hollow dots and approximated by the continuous line 44. There are two regions of interest in the comparison of these two sets of samples. First, for that region above 10 at. % hydrogen, both the HW and GD samples display similar characteristics, in that the Urbach tail widths increase rapidly in this region. For that region below 10 at. % hydrogen, the GD films again show increasing Urbach tail widths. However, the HW films, deposited according to the principles of the present invention, remain approximately at a 50 meV minimum until well below a hydrogen concentration of 1 at. %. This 50 meV value of Urbach tail width is respectable and is typical of device quality films. Therefore, this graphic representation in FIG. 3 illustrates that the HW film with substantially lower H content (1 at. %) according to this invention is of comparable device quality to the more conventional GD films having more moderate content (10 at. %). Yet, as described above, the HW film according to this invention is less susceptible to Staebler-Wronski effect degradation because of its much lower H content.

Figure 4:
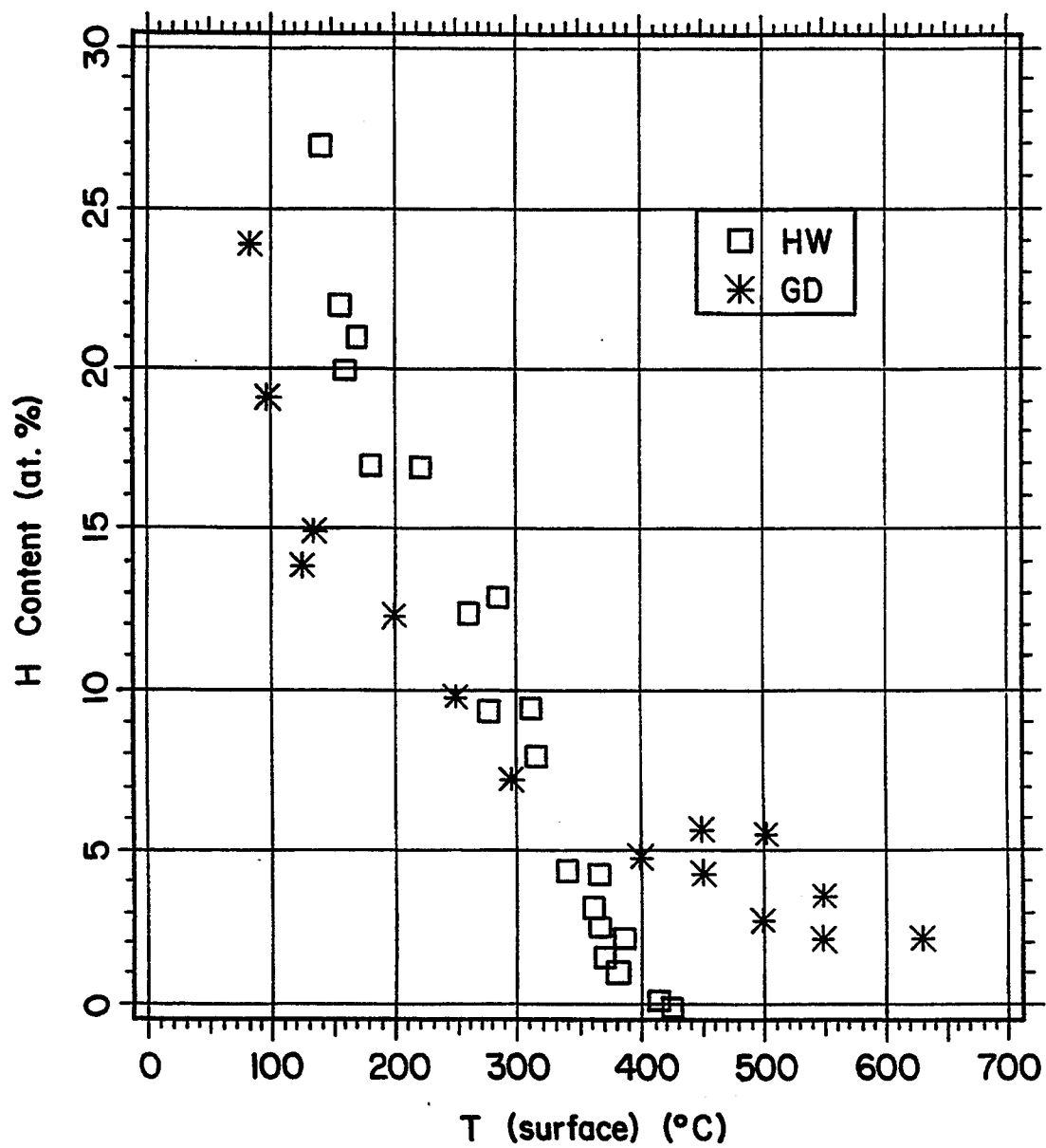
FIG. 4 is a graph of the H contents of the respective hot wire and glow discharge films plotted as a function of the surface temperature of the growing film, indicating possible differences in how the H is bonded in the two series of films.

It is important to note that it was impossible, in making the two sets of films, to lower the H content of the GD films below the values of 2–3 at % and thus enable a comparison with the low H constant HW films, without the GD films becoming microcrystalline. FIG. 4 shows a graph of the H contents of the respective films as a function of the surface temperature of the growing film. For hydrogen contacts greater than about 10 at. %, the predominant mode of binding was in the SiH, or monohydride, mode (see FIG. 2) for both sets of films. However, for temperatures in excess of 400° C., almost all the H is removed from the HW films, while a significant amount of H still remains incorporated in the GD films. These data suggest basic differences in how the H in the monohydride mode is bonded in the two sets of films as the substrate temperature is increased, which may explained in part the differences in the structural, electronic, and light soaking properties observed between the low H content HW and GD films.

Figure 5:
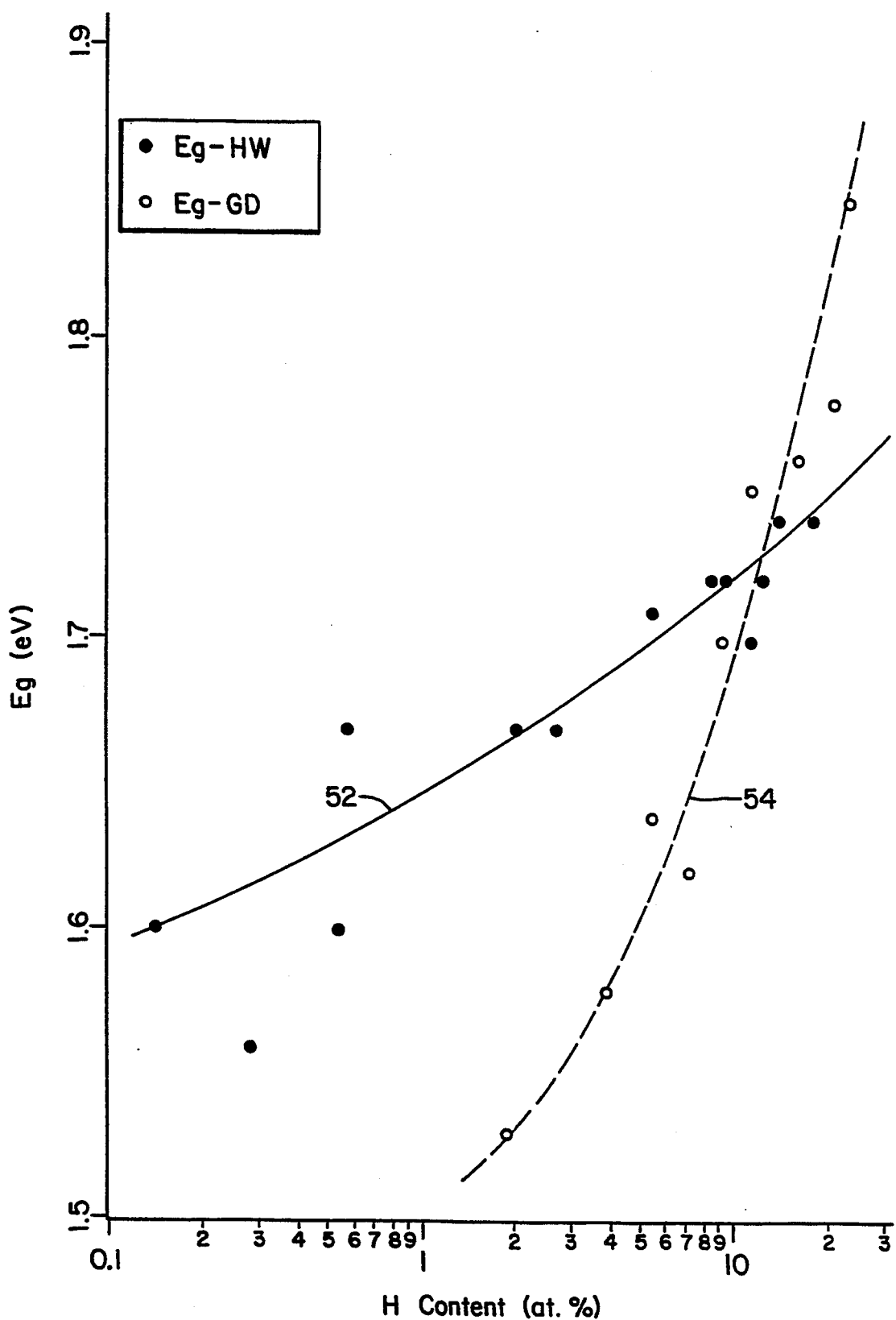
FIG. 5 is a graph of Tauc's Bandgap versus hydrogen content of the same series of hydrogenated amorphous silicon films produced according to the principles of the present invention and the same series of traditional glow discharged deposited hydrogenated amorphous silicon films for comparison.

The measured values of the Tauc's bandgaps ($E_g$), in electron volts, for the two sets of samples are plotted in FIG. 5 once again against a logarithmic scale of hydrogen content in atomic percent. As with the prior graph in FIG. 2, the solid dots represent the discrete HW data and the hollow dots represent the discrete GD data. This HW data is approximated by continuous line 52 and the PECVD data is approximated by continuous line 54. Both show the traditional linear dependence of bandgap ($E_g$) and at. % hydrogen. However, the HW films produced in accordance with the principles of the present invention, show a more flattened linear relationship, which is indicative of a film with greater integrity and less dependence on the number of hydrogen bonds.

Figure 6:
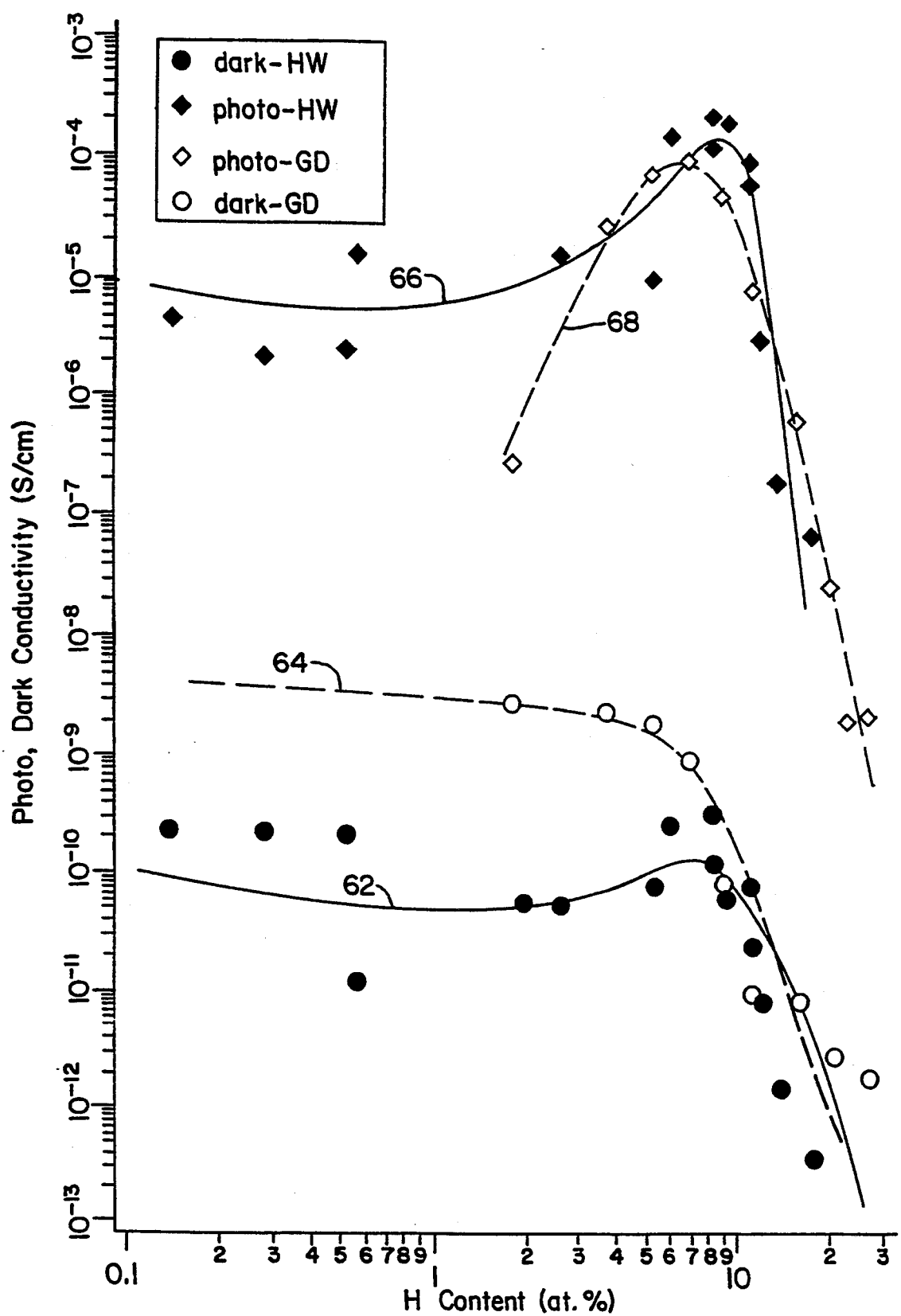
FIG. 6 is a graph of Photo and Dark Conductivity versus hydrogen content of the hydrogenated amorphous silicon films produced according to the principles of the present invention and the traditional glow discharge deposited hydrogenated amorphous silicon films for comparison.

The Photo and Dark Conductivity, expressed in S/cm, for both the HW and GD sets are plotted on the same graph, in FIG. 6, against a logarithm scale of hydrogen content in at. %. Once again the HW data for the films produced in accordance with the present invention are the solid discrete points, which, in this case, are circular dots for the Dark Conductivity and diamond shapes for the Photoconductivity. Similarly, the hollow circular dots represent the Dark Conductivity for the GD films samples, and the hollow diamonds represent the Photoconductivity for the GD films. Line 62 approximates the Dark Conductivity for the HW films, and line 64 approximates the Dark Conductivity for the GD films. Line 66 represents an approximation of the Photo-conductivity of the HW film samples, and line 68 the Photo-conductivity of the GD film samples.

In that region above a hydrogen content of 10 at. % hydrogen, both sets of data in FIG. 6 show similar characteristic rapidly decreasing conductivity for both Photo and Dark Conductivity for increasing at. % H. However, for that region below a hydrogen concentration of 10 at. % hydrogen, including 1 at. % hydrogen and below, the films of the HW samples deposited according to the principles of the present invention show much higher levels of Photoconductivity and lower levels of Dark Conductivity, both of which are marked improvements over the GD films. Note that the only way of reaching H contents less than 1 at. % for the GD films is to take a film previously deposited at a lower substrate temperature (e.g., 250° C.) and anneal it in vacuum to drive out the bonded H. When this is done, enabling H contents in the range 1.0–0.5 at. % to be produced, the ratio of photo or light to dark conductivity for the GD films is on the order of 2–3, while the photo or light to dark conductivity ratio for as grown HW films of comparable H contents is on the order of $10^4$. This result again illustrates the superior electronic nature of the low H constant HW films.

Preliminary Electron Spin Resonance (ESR) measurements were taken on a 7 μm thick sample of the HW film at a hydrogen content of 10 at. %, and on a 1.5 μm thick sample of a 0.6 at. % hydrogen content sample of a HW film, both deposited in accordance with the principles of the present invention. The former film contained $3 \times 10^{15}$/cm$^3$ spins, which is typical of device quality hydrogenated amorphous silicon films deposited by the GD Technique, while the latter HW film had a spin density of $1.3 \times 10^{16}$/cm$^3$ spins, which is considerably lower than has been previously observed for a GD film in this range of hydrogen content.

The final comparison of the quality for these two samples, the ambipolar diffusion lengths, were measured by the steady state photograting technique. The HW films produced according to the principles of the present invention gave values for the ambipolar diffusion lengths as high as 2000 Å for the films with low hydrogen concentrations, which are greater than those values observed for device quality GD hydrogenated amorphous silicon films (about 1500 Å) containing larger (10 at. %) hydrogen contents.

In summary, the data shows that for a hydrogenated amorphous silicon film deposited according to the principles of the present invention, with a hydrogen content as low as 1 at. %, the photoconductivity is between 1 and $2 \times 10^{-5}$/cm, the light to dark conductivity ratio is greater than $10^5$, the Urbach tail width is 50 meV, the bandgap is 1.67 eV, and the ambipolar diffusion length is as high as 2000 Å. All of these data are indicative of device quality electronic performance.

Figure 7:
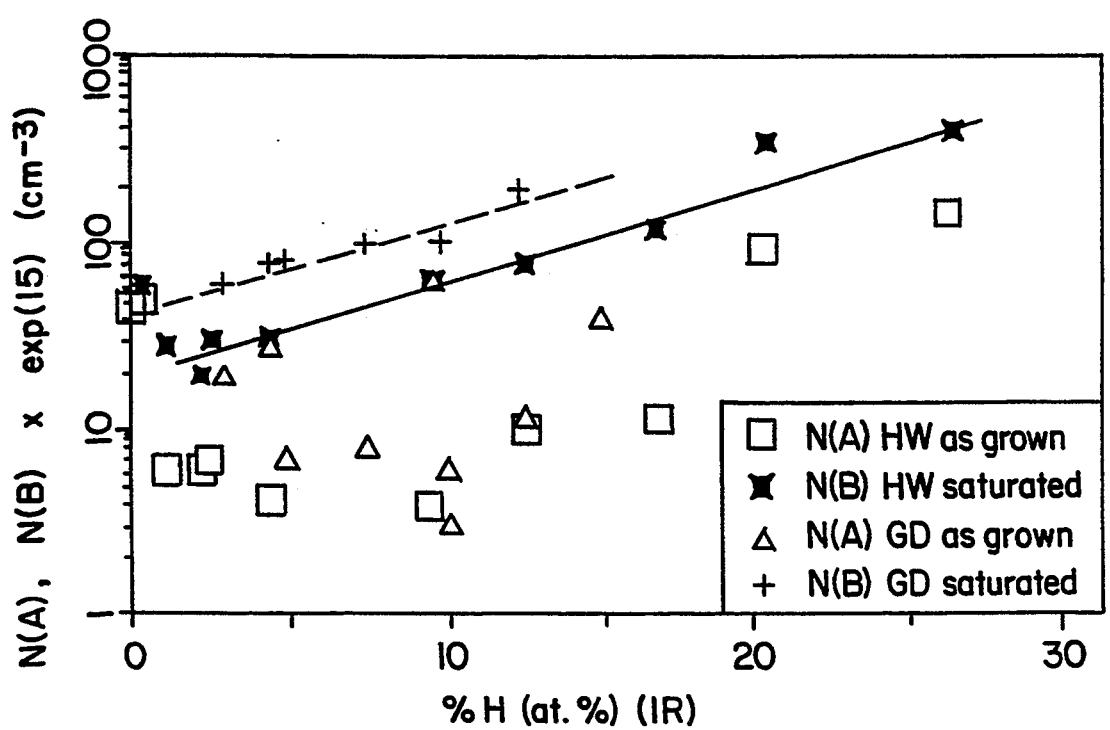
FIG. 7 is a graph comparing midgap defect density values for hot wire and glow discharge samples as grown and light soaked versus hydrogen concentration.

Finally, in FIG. 7, we show values of the midgap defect density for selected HW and GD films, plotted versus a linear scale of hydrogen concentration in at. %, in the samples (N(A)) as grown, and also for samples (N(B)) when they are light soaked to saturation in a way such that no further increase in midgap state density is observed to occur upon additional light soaking. A linear scale of H concentration was chosen here, because no light soaking comparisons were made for samples containing H contents <1 at. %. The important point illustrated in FIG. 7 is that the saturated defect densities for the HW films are consistently lower than those for the GD samples containing comparable H contents, and the saturated values for the HW samples containing low H contents (1–4 at. %) are lower than the values for state of the art GD samples deposited at substrate temperatures of 250° C. and containing approximately 10 at. % H. This data supports the observation that degradation of photoelectric cells upon exposure to sunlight can be reduced when the low H content a-Si:H material, which is the subject of the present invention, is incorporated into such a cell.

Accordingly, a process has been provided that demonstrates fast rate, large area deposition of device quality, low hydrogen content, hydrogenated amorphous silicon films. The low hydrogen content, hydrogenated amorphous silicon films exhibit greater material integrity and stability because of the lowered hydrogen content, while still demonstrating improved electrical, chemical, and structural properties, is not as subject to Staebler-Wronski effect degradation as the conventional device quality films, which prior to the invention, had to be produced with substantially higher hydrogen content to achieve device quality electronic characteristics.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiments of the invention in which an exclusive property or privilege is claimed are defined as follows:

1. A method of producing hydrogenated amorphous silicon on a substrate, comprising the steps of:
    positioning the substrate in a deposition chamber at a distance of about 2 to 30 cm from a heatable filament in the deposition chamber;
    evacuating said deposition chamber to a vacuum in the range of about 5 to 50 millitorr, heating the filament to a temperature in the range of about 1,500° to 2,000° C., and heating the substrate to a temperature in the range of about 330° to 600° C.; and flowing a stream of silicohydride gas or a combination of gases containing silicon and hydrogen into contact with said heated filament to decompose said silicohydride gas or said combination of gases into radical silicon and hydrogen atomic species and allowing said radical silicon and hydrogen atomic species to migrate to and deposit on said substrate while adjusting and maintaining said vacuum in said deposition chamber at a value within said 5 to 50 millitorr range in a relation to the 2 to 30 cm distance between said filament and said substrate that produces statistically about 20 to 40 atomic collisions between the radical silicon and hydrogen species and the undecomposed molecules of the silicohydride gas or combination of gases in the deposition chamber as said radical silicon and hydrogen species migrate from said filament to said substrate.

2. The method of claim 1, wherein said steps of positioning the substrate in the deposition chamber and maintaining the vacuum in the deposition chamber to produce said statistically about 20 to 40 atomic collisions between the radical silicon and hydrogen atomic species and the undecomposed molecules comprises positioning the substrate about 5 to 6 cm from the filament and maintaining the vacuum at about 8 millitorr.

3. The method of claim 1, including the step of maintaining the temperature of the substrate at about 400° C. during deposition to produce said hydrogenated amorphous silicon on said substrate with less than 10 atomic percent hydrogen.

4. The method of claim 1, including the step of maintaining the temperature of the filament at about 2,000° C. during deposition.

* * * * *